United States Patent [19]

Mitterauer

[11] Patent Number: 4,783,741
[45] Date of Patent: Nov. 8, 1988

[54] COMPUTER SYSTEM FOR SIMULATING RETICULAR FORMATION OPERATION

[76] Inventor: Bernhard Mitterauer, Viehhausen 59, A-5071 Wals bei Salzburg, Austria

[21] Appl. No.: 639,361

[22] Filed: Aug. 8, 1984

[30] Foreign Application Priority Data

Aug. 8, 1983 [DE] Fed. Rep. of Germany ....... 3328610

[51] Int. Cl.$^4$ ............................................. G06F 15/42
[52] U.S. Cl. .............................. 364/413.01; 364/300; 128/723
[58] Field of Search ....................... 364/413, 300, 573; 128/906, 723

[56] References Cited

U.S. PATENT DOCUMENTS 4,290,114 9/1981 Sinay .................................. 364/300

OTHER PUBLICATIONS

Scheibel, M. E. et al., "Structural Substrates for Integrative Patterns in the Brain Stem Reticular Core", *Reticular Formation of the Brain*, 1958, pp. 31–55.
Scheibel, M. E. et al., "The Brain Stem Reticular Core--and Integrative Matrix" *Systems Theory and Biology*, 1968, pp. 261–285.
Scheibel, M. E. et al., "Dendrite Bundles as Sites for Central Programs; an Hypothesis", *Intern. J. Neuroscience*, vol. 6, 1973, pp. 195–202.
McCulloch, W. S., "Where is Fancy Bred?", *Embodiments of Mind*, 1965, pp. 216–224.
Kilmer, W. L. et al., "A Model of the Vertebrate Central Command System", *Int. J. Man-Machine Studies*, vol. 1, 1969, pp. 279–309.

*Primary Examiner*—Jerry Smith
*Assistant Examiner*—Kimthanh Tbui
*Attorney, Agent, or Firm*—Felfe & Lynch

[57] ABSTRACT

A system for simulation of the reticular formation is described. The system comprises as a central processing unit a command computer (4) structured on the basis of a permutograph and comprising a plurality of storage modules (M), with the storage modules (M) corresponding to the elements and the connections between the storage modules to the edges of the permutograph. The connections establish internal circuits which correspond to the negation sequences of the permutograph in the form of Hamilton loops (HK), there being associated with each Hamilton loop a behavior pattern of the reticular formation. The command computer (4) is controlled by input computers (1, 2, 3) in which a preprogrammed intended action is related to environmental information. The possibly new intended action computed therefrom is entered in the command computer (4) as a control command.

19 Claims, 7 Drawing Sheets

| INPUT | | OUTPUT | | |
|---|---|---|---|---|
| ENABLE ROM 1 | ADDRESSES | SEQUENCE OF MODULE SELECTION | PREFERRED INTENDED ACTION OF MODULE | NEXT NEGATION OPERAND |
| YES | 0 | 1 | 1 | 1 |
| YES | 1 | 1 | 1 | 1 |
| YES | 2 | 7 | 2 | 2 |
| YES | 3 | 13 | 3 | 3 |
| YES | 4 | 19 | 4 | 2 |
| YES | 5 | 20 | 4 | 3 |
| YES | 6 | 14 | 3 | 2 |
| YES | 7 | 8 | 2 | 1 |
| YES | 8 | 2 | 1 | 2 |
| YES | 9 | 4 | 1 | 1 |
| YES | 10 | 10 | 2 | 2 |
| YES | 11 | 16 | 3 | 3 |
| YES | 12 | 12 | 4 | 2 |
| YES | 13 | 24 | 4 | 3 |
| YES | 14 | 18 | 3 | 2 |
| YES | 15 | 12 | 2 | 1 |
| YES | 16 | 6 | 1 | 2 |
| YES | 17 | 5 | 1 | 1 |
| YES | 18 | 11 | 2 | 2 |
| YES | 19 | 17 | 3 | 3 |
| YES | 20 | 23 | 4 | 2 |
| YES | 21 | 21 | 4 | 3 |
| YES | 22 | 15 | 3 | 2 |
| YES | 23 | 9 | 2 | 1 |
| YES | 24 | 3 | 1 | 2 |
| NO | x | ⓧ | ⓧ | ⓧ |

FIG. 9
*) HL = HAMILTON LOOP

COMPUTER SYSTEM FOR SIMULATING RETICULAR FORMATION OPERATION

The invention relates to a system for simulating reticular formation operation with a computer.

The reticular formation (RF) is located in the brain stem. With regard to the structure and (modal) operation of the RF, reference is made especially to the following publications:

Scheibel, M. E. & Scheibel, A. B. (1958), Structural substrates for integrative patterns in the brain stem reticular core. In: Reticular Formation of the Brain. Eds. H. H. Jasper et al. Boston, Little and Brown.

Scheibel, M. E. & Scheibel, A. B. (1967), Anatomical basis of attention mechanisms in vertebrate brains. In: The Neurosciences, A Study Program. Eds. G. Quarton et al. New York, The Rockefeller Unicversity Press.

Scheibel, M. E. & Scheibel, A. B. (1968), The brain stem reticular core-an integrative matrix. In: Systems Theory and Biology. Ed. Mesarovic, M. D. Springer Verlag New York Inc.

Scheibel, M. E. & Scheibel, A. E. (1973), Int. J. of Neuroscience, Vol. 6, pages 195–202:

McCulloch, W. S. (1965), Embodiments of Mind. Cambridge, Mass. MIT Press.

W. L. Killmer, W. S. McCulloch and J. Blum, Int. J. Man-Machine Studies (1969), Vol. 1, pages 279–309.

According to these authors, the structure and (modal) operation of the RF may be characterized as follows:

1. The RF is the decision-making center (command computer) which recommends to the whole organism one particular basal (modal) behavior pattern out of a relatively small number of such patterns, for example, sensory/motor, ascending/descending, or moving away/coming closer.
2. The RF is an integrative matrix which is linked to all brain and spinal-cord systems but has no direct contact with the environment. Its structure is the same in all vertibrates.
3. The RF cannot "invent" new behavior patterns and cannot execute its own commands.
4. The problem of the RF is how its several million neurons can reach a working concensus with respect to the proper mode of total commitment within a fraction of a second
5. The RF has a redundancy of potential command, with the modules, or neurons, having the highest-priority information carrying the most authority.
6. The RF has several properties which are unique in the central nervous system, namely:
    6.1 In the region of the center two thirds of the RF, dendrite stems extend primarily in the dorso ventral direction and only to a very limited extent in the longitudinal direction of the brain stem. The pronounced rostrocaudal compression has given rise to comparison with a stack of poker chips, each about 100 microns thick, arrayed along the longitudinal axis of the RF. (Scheibel & Scheibel, 1968, page 272.) In a sagittal section through the lower half of the brain stem of a 10-days-old rat, for example, the callteral fibers of Tractus pyramidalis and an individual axon illustrate the tendency of the afferent terminal branches of the axon to organize in planes which are approximately perpendicular to the lobngitudinal axis of the stem. The dendrites of the RF cells in the stem are parallel to the terminal branches, in contrast to the dendrite organization of the adjacent nucleus n. hypoglossi, so that the RF may be regarded as a string of neuropil segments. (Scheibel & Scheibel, 1958, page 35.)
    6.2 For simplicity, the lower two thirds of the RF may be regarded as a three-dimensional matrix resembling a crystal lattice. Every lattice intersection can then be regarded as a site where a reticular neuron may be present. Because of the observably random distribution of the neurons in the RF, however, it must be assumed, that neurons will be found at many but not all lattice intersections. (Scheibel & Scheibal, 1968, pages 270 to 271.)

Simulations of RF operation with computers have already been proposed. (W. L. Killmer, W. S. McCulloch and J. Blum, Int. J. Man-Machine Studies [1969], vol. 1, pp. 279 to 309.) In these, Scheibel & Scheibel's "poker chips", are replaced by modules with nonlinear probabilistic computers. Each module receives input data from some but not all input systems, as in the neuroanatomy, and each module feeds data directly to some but not all other modules and receives data from some but not all other modules. The connections between the modules are such that adjacent modules have tighter data coupling than modules which are more remote from one another. It is hypothesized that this corresponds to the axonal anatomy of the RF.

In the view of McCulloch (Embodiments of Mind, 1965), the main problem is that the RF has a redundancy of potential command. Every element of the RF has the capability of stimulating the entire system to take the necessary action. However, with this redundancy of potential command, the decision is made by the element which has the highest-priority information. As McCulloch points out in the publication cited (Embodiments of Mind), it has not been possible up to now to build a computer corresponding to the RF with a redundancy of potential command.

The object of the invention thus is to provide a system which corresponds to the RF also with respect to redundancy of potential command.

In accordance with the invention, this object is accomplished by a computer system for simulating reticular formation operation, having a perception computer for sensing the environment and providing environmental data therefrom, an intended action computer for providing one of at least two programs respectively corresponding to intended actions, the programs being permutations of each other, a relations computer for weighting the environmental data from the perception computer according to a table set by the one program provided by the intended action computer, and a command computer for selecting the one program.

The point of departure for the invention is the recognition of the fact that the three-dimensional matrix of the neurons (dendrites and axons) of the and their nerve processes RF correspond to the elements and edges, respectively, of a three-dimensional permutograph.

A detailed description of the negative language theory on which the permutograph is based, and of the permutograph, will be found in the following publications:

Günther, G. (1980): Identität, Gegenidentität and Negativsprache (Identity, counteridentity and negative language). In: Beyer, W. R., Hegel-Jahrbuch 1979, Pahl-Rugenstein, Cologne.

Thomas, G. G. (1982): On Permutographs. Supplemento ai Rendiconti del Circolo Matematico di Palermo (Supplement to the Proceedings of the Mathematics Circle of Palermo), Series II/2, pages 275–286.

The principle of the permutograph will now be described with reference to FIG. 1, which represents a two-dimensional quadrivalent permutograph, that is to say, a permutograph of the four integers 1, 2, 3 and 4. The number of permutations of the four integers and, hence, of permutograph elements or nodes is 4!=24. These elements 1 to 24 shown in FIG. 1 and correspond to the following permutations:

| | | | |
|---|---|---|---|
| ① | 1234 | ⑬ | 3124 |
| ② | 1243 | ⑭ | 3142 |
| ③ | 1324 | ⑮ | 3214 |
| ④ | 1342 | ⑯ | 3241 |
| ⑤ | 1423 | ⑰ | 3412 |
| ⑥ | 1432 | ⑱ | 3421 |
| ⑦ | 2134 | ⑲ | 4123 |
| ⑧ | 2143 | ⑳ | 4132 |
| ⑨ | 2314 | ㉑ | 4213 |
| ⑩ | 2341 | ㉒ | 4231 |
| ⑪ | 2413 | ㉓ | 4312 |
| ⑫ | 2431 | ㉔ | 4321 |

Figure 1:
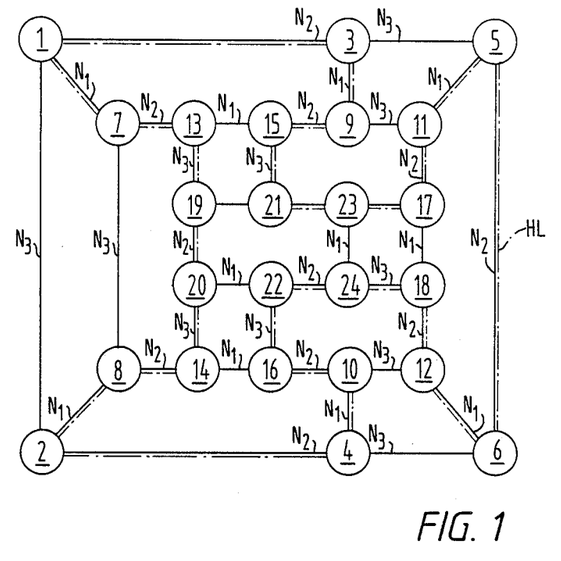
FIG. 1 is a two-dimensional quadrivalent permutograph.

The permutations of the elements 1 to 24 can be generated with three NOT operators $N_1$, $N_2$ and $N_3$ which each exchange two adjacent values by the following scheme:

For example, the NOT operator $N_3$ will exchange integers of the permutation of the element 3 into that of the element 5, and the NOT operator $N_2$, the element 16 into that of the element 10, by the following scheme:

In FIG. 1, the individual NOT functions $N_1$, $N_2$ and $N_3$ are represented between the elements.

It is possible to form loops (coding possibilities), each of which passes through all the elements of a permutograph once. They are computable and known as Hamilton loops.

As is apparent from the table which follows, there are 44 Hamilton loops in a quadrivalent permutograph. In this connection, it should be noted that not only Hamilton loops but also loops of different lengths can be computed with a permutograph. (Kaehr 1982; see also Thomas 1982.) In principle, the permutograph thus is capable of computing also partial instructions for actions (cyclic relations, negation sequences, and commands) which do not involve the system as a whole.

TABLE

DETERMINATION OF ALL CIRCUITS IN $PG_1(4)$
(after Kaehr, 1982, Einschreiben in Zukunft
[Write-in in the future], in: Hombach, D.,
Zeta 01-Zukunft als Gegenwart [Future as present],
p. 235; Rotation, Berlin)

| Number of nodes | Length of circuit | | | | | | | | | | | Sum |
|---|---|---|---|---|---|---|---|---|---|---|---|---|
| | 4 | 6 | 8i | 10 | 12 | 14 | 16 | 18 | 20 | 22 | 24 | |
| 6 | 0 | 1 | — | — | — | — | — | — | — | — | — | 1 |
| 8 | 1 | 0 | 1 | — | — | — | — | — | — | — | — | 2 |
| 11 | 1 | 0 | 1 | 1 | — | — | — | — | — | — | — | 3 |
| 12 | 1 | 0 | 1 | 2 | 1 | — | — | — | — | — | — | 5 |
| 15 | 0 | 1 | 2 | 5 | 4 | 0 | — | — | — | — | — | 12 |
| 16 | 0 | 1 | 2 | 5 | 9 | 6 | 1 | — | — | — | — | 24 |
| 18 | 0 | 1 | 2 | 5 | 15 | 15 | 5 | 4 | — | — | — | 47 |
| 20 | 0 | 1 | 1 | 4 | 15 | 19 | 25 | 11 | 2 | — | — | 78 |
| 21 | 1 | 0 | 2 | 5 | 17 | 31 | 35 | 25 | 10 | — | — | 126 |
| 22 | 1 | 0 | 2 | 6 | 28 | 44 | 58 | 55 | 29 | 4 | — | 227 |
| 23 | 0 | 1 | 2 | 9 | 43 | 75 | 112 | 135 | 111 | 24 | — | 512 |
| 24 | 1 | 2 | 8 | 30 | 132 | 266 | 472 | 690 | 760 | 308 | 44 | 2713 |
| Total number of circuits | 6 | 8 | 24 | 72 | 264 | 456 | 708 | 920 | 912 | 336 | 44 | 3750 |

The various Hamilton loops differ in NOT operator or negation sequence. For example, starting from the element 1 in FIG. 1, a Hamilton loop is formed by linking the following elements:

① → ⑦ → ③ → ⑨ → ⑳ → ④ → ⑱ →

② → ④ → ⑩ → ⑯ → ㉒ → ㉔ → ⑬ →

⑭ → ⑥ → ⑤ → ⑪ → ⑰ → ㉓ → ㉑ →

⑮ → ⑲ → ⑧ → ①.

This Hamilton loop HL is defined by the following NOT operator or negation sequence:

$N_1-N_2-N_3-N_2-N_3-N_2-N_1-N_2-N_1-N_2-N_3-N_2-$ $-N_3-N_2-N_1-N_2-N_1-N_2-N_3-N_2-N_3-N_2-N_1-N_2$

In FIG. 1, this Hamilton loop HL or negation sequence is indicated by a dash-dotted line.

In place of the two-dimensional quadrivalent permutograph shown in FIG. 1, a three-dimensional permutograph can be generated on the same principles. A corresponding but three-dimensional pentavalent permutograph is also known.

In accordance with the point of departure of the invention, therefore, the structure of a three-dimensional permutograph with its elements (nodes) and edges (connecting lines of NOT operators) corresponds to the anatomy of the medial lower two thirds of the RF of the brain stem. In other words, the anatomical picture of the RF, which may be regarded as a three-dimensional matrix resembling a crystal lattice, as indicated, can also be interpreted as a permutograph, so far as neurons and nerve processes (dendrites and axons) are concerned, in which the neurons represent the elements (nodes), and the nerve processes the edges (connecting lines of NOT operators).

Put another way, the nervous system of the RF formally corresponds biuniquely to a permutograph, with the neurons of the RF corresponding to the elements (nodes), and the nerve processes (dendrites and axons) of the RF to the edges (connecting lines and NOT operators), of the permutograph.

The RF is an active biological system which uses information from the environment for selecting a particular behavior pattern (mode).

By the analogy to a permutograph, this process is dealt with as follows:

A given negation sequence is established. Which negation sequence this is depends on the behavior pattern (mode) that has the highest priority in the system. The established negation sequence forms a closed loop which passes only once through all neurons i.e., a (Hamilton loop). However, the bahavior pattern of the overall system which is associated with this Hamilton loop becomes effective only after integration of all available information in the form of a specific instruction for action (command).

The integration of information proceeds as follows:

(a) In principle and by definition, the Hamilton loop established may start at any neuron (node, e.g. element 1 in FIG. 1).

(b) From which neuron the established Hamliton loop starts depends on which neuron has the highest-priority environmental datum (from one of the five sensory systems, for example).

(c) Highest-priority environmental datum means that a neuron has been fed a datum from the environment which corresponds biuniquely to it.

Since any neuron may have the highest-priority environmental datum in the overall system of the RF and will then trigger the command for a specific behavior of the overall system, there exists in the RF the previously mentioned redundancy of potential command.

The RF thus functions on the basis of an abductive logic, that is to say, (a) the RF establishes (selects) a coding program (negation sequence or Hamilton loop) which corresponds to a specific, intended behavior pattern (for example, approaching);

(b) the RF is confronted with (informed of) an environmental datum; and (c) the RF then determines whether that environmental datum comes within the coding program.

For example, if a system is at high temperature and it is intended that it cool off, then out of the environmental data "stone", "window", "shade" and "automobile" it will unambiguously be "shade" that comes within the coding program to cool off.

The operating cycle of the RF basically goes through the following phases:

(a) Intrasystem intention to take action, in other words, constant readiness to make decisions.

(b) Data input to neurons through appropriate environmental information.

(c) Taking of action by the entire system in the form of a specific behavior, with the programs for action being selected on the basis of the environment-imposed level of priority.

(d) Intrasystem reconstruction in the sense of an intention to take further action.

The system of the invention operates abductively/diagnostically, in conformity with the RF, along the following lines:

The computer system has a repertoire of behavior patterns (modes), each of which is generated within the system in accordance with a rule, that is to say, a sequence of NOT operators which form a Hamilton loop. The number of such rules is determined by the design of the computer system. The computer system, when confronted with one or more environmental data, must decide at once which rule (sequence of NOT operators) is to be applied in this case. Its decision then enables the behavior pattern (mode) corresponding to the environmental data.

The relationships described above thus make it possible to simulate the logic operation of the biological RF in the computer system.

The neurons of the RF are represented by the storage modules of the computer system while the nerve processes (dendrites and axons) of the RF are represented by the connections between the storage modules.

The storage modules of the command computer may be formed individually of conventional addressable read-only memories, or ROM's, which on the input side can be activated through address and control lines. The operation of the storage modules is controlled by a clock generator in the form of a ring counter, for example, with places corresponding to the number of storage modules. Inputer computers route the number of a storage module over the address lines while the other control lines carry the number of the currently selected Hamilton loop and a specific priority level that will be explained further on. On the output side, the address of the next storage module of the selected Hamilton loop, and, if indicated, the priority level are transmitted over outputs lines to the storage module which is next in the selected Hamilton loop. In addition, there is present at the output the negation value applicable to the current Hamilton loop, which is delivered to an output shift register. Provision is thus made for complex connection of the storage modules to one another and to the controlling input computers. From this alone it is apparent that each Hamilton loop within the command computer can be started by external addressing from any desired storage module. For example, in the two-dimensional quadrivalent permutograph represented in FIG. 1 lexicographically, the Hamilton loop HL might have been started at a storage module corresponding to element 5. This, however, will occur only if the permuted sequence of programs corresponding to preferred Hamilton loops, that is to say, in this case the program sequence 1-4-2-3, is recognized also by the input computers as the optimum program sequence. Since in principle every storage module is able to determine the sequence of commands, defined by a sequence of Hamilton loops, at the output of the command computer, there is redundancy of potential command.

Instead of setting up the storage modules as separate read-only memories which are connected to one another and to the input computers, it is also possible to construct the command computer with addressable read-only memories, each associated with a selected Hamilton loop. These ROM's then have a number of address lines and control lines for enabling the current ROM that corresponds to the number of storage modules. The memory locations in such a ROM are then set up so that in the sequential scanning of the address lines the negation sequence determining the Hamilton loop is present at the output of the ROM. At the output there further appears an identification of the particular storage module being accessed and of its preferred Hamilton loop or of the preferred program sequence. The identification designates the currently activated storage module, which can be compared in a comparator with the storage module that has been specifically selected by the input computers and holds the program sequence best adapted to the actual environmental situation. When these two numbers or identifications of the storage modules coincide, the comparator transmits a signal for the start of the same Hamilton loop from the preferred storage module. If as a result of a new environmental situation there appears at the output of the input computers a new program sequence corresponding to a sequence of Hamilton loops that represents a change over the previous sequence, this new sequence is likewise identified by another storage module. When the identification of that storage module is fed to the comparator during the run through the Hamilton loop then active, the comparator transmits a signal for activation of the currently preferred storage module within another Hamilton loop. This activating signal is subjected to a time delay due to the fact that the Hamilton loop previously activated in the command computer must be run through to the end. For example, if up to now a storage module corresponding to element 5 (FIG. 1) with the program sequence 1-4-2-3 was cut in within Hamilton loop HL and a relations computer now determines on the basis of new environmental information that another program sequence, for example, the program sequence 4-3-2-1, is to be executed, the input computers feed to the comparator the identification or number of storage module corresponding to element 24 (FIG. 1) which contains this new program sequence. When during the run through the previously activated Hamilton loop HL the ROM of the command computer feeds the number of this storage module to the comparator, the latter will deliver, after the mentioned delay, if any, a change-over signal resulting in a switch to another Hamilton loop, which is started from the preferred storage module corresponding to element 24 (FIG. 1)

Such implementation of the command computer in the form of read-only memories for the selected Hamilton loops requires considerably less wiring than a command computer assembled from separate ROM's. The principle of operation remains unchanged, with the result that here, too, there is redundancy of potential command.

As pointed out earlier, the data made available by the input computers weighted, that is to say, assigned respective priority levels in order that the command computer may always be actuated so that it will deliver what is the "optimum" command at the time. This "optimum" command corresponds to a course of action which approximates the intended actions most closely, allowing for the instantaneous environmental situation. This weighting occurs in the relations computer in that an appropriate level is assigned to each input signal on the basis of a fixed weighting table. These input signals are a data supplied by the intended-action computer, a data furnished by the perception computer, and the data fed back from the command computer to the relations computer and corresponding to the instantaneous status of the command computer, that is to say, corresponding to the currently activated Hamilton loop. Such weighting is necessary in order that the input computers may be able to decide which storage module is to be selected preferentially with due regard to both the intended action and the prevailing environmental data.

The environmental data which is fed to the relations computer through the perception computer is usually supplied by several different sensors, for example, visual, tactile and auditory sensors. The output signals of these sensors are fed to individual perception processors and there appropriately interpreted. To secure also in this case redundancy of potential command in the command computer, it is necessary to provide for each group of sensors an individual command computer, the different command computers—in the case mentioned, the command computers responsive to visual, tactile or auditory data—then being "somatotopically" stacked. The individual modules of these individual command computers must be connected to the identical modules in the other command computers. Moreover, the individual command computers are operated in synchronism. For each sensor group, a specific Hamilton loop is established in the appropriate command computer, which is again done by selection of the currently preferred storage module. Which command computer or which Hamilton loop actually appears in the end as the output of the command-computer group will be determined by internal priority assignment. This decision is made in that the preferred storage module activated by the relations computer compares its own priority level with that of the storage module in the command computer then cut in. If that priority level is higher than that of the storage module last cut in, a pulse requesting a change-over is transmitted by the activated storage module. This change-over pulse causes all storage modules with the exception of the one transmitting the pulse to switch to data reception and to receive the priority information of the newly activated storage module. For example, of the identical storage modules of the different command computers, the storage module in the command computer responsive to visual data may thus be assigned the level 2, the storage module responsive to tactile data, the priority level 3, and the storage module responsive to auditory data, the priority level 1. All of these priority levels are applicable to the same Hamilton loop. Thus, if the command computer for visual data were cut in and tactile data of higher priority were present, a change-over would be made at the storage module under consideration to the command computer which is responsive to tactile data since the associated storage module has the highest priority level. Assurance is thus provided that within a Hamilton loop, that is to say, within a course of action, it is always the best-informed storage module that determines the command to be generated.

The output register of the command computer is fed to an executive computer and, as feedback, to the relations computer. In the executive computer, the command present in the form of a negation sequence is converted to operating commands for actuators, for example, servomotors for a forward movement or a retreating movement, operating commands for the actuation of the sensors, etc.

With a computer system in accordance with the invention, it is possible to construct an automaton able to execute a sequence of actions, programmed in the intended-action computer, with due regard to environmental conditions.

The invention will now be explained in greater detail in terms of exemplified embodiments with reference to drawings, wherein.

Figure 2:
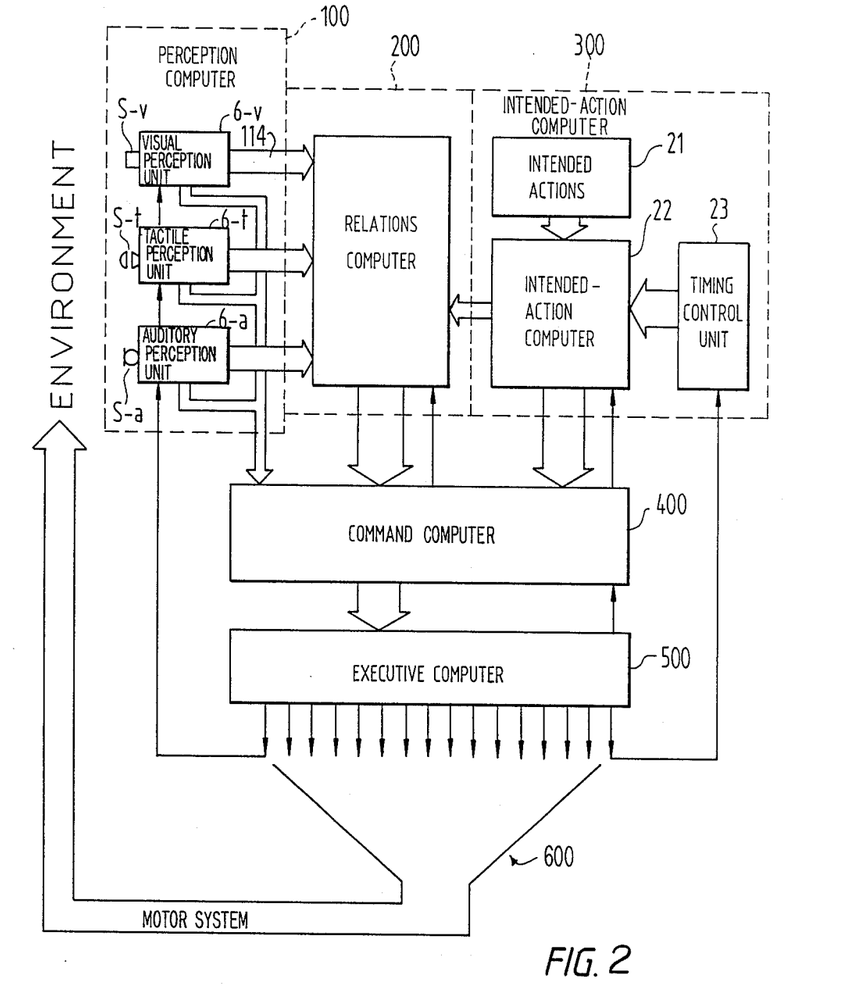
FIG. 2 is a block diagram of a computer system in accordance with the invention in an automation.

Shown in FIG. 2 is a block diagram of a computer system, based on the principle of redundancy of potential command, for an automaton. The computer system is assembled from conventional components arranged in mainly conventional computers with defined input and output signals. The components of the computer system are a perception computer 100 having individual perception processors (visual) 6-v, (tactile) 6-t and (auditory) 6-a with respective sensors S-v, S-t and S-a, for picking up and processing environmental data, a relations computer 200 for evaluation of the data furnished by the perception computer 100 in view of data supplied by an intended-action computer 300, and a somatotopically stacked command computer 400 which is fed data by the former computers 100, 200 and 300 and computes from the data so received commands for an executive computer 500. The latter converts these commands into operating instructions for a motor system at 600 (not shown in detail) of the automaton.

The three sensors of the perception computer 100 shown in FIG. 2 are, actually, each groups of sensors, namely, visual sensors S-v, tactile sensors S-t and auditory sensors S-a (only one each shown), each of which is connected to the respectively perception processor 6-v, 6-t and 6-a.

Figure 3:
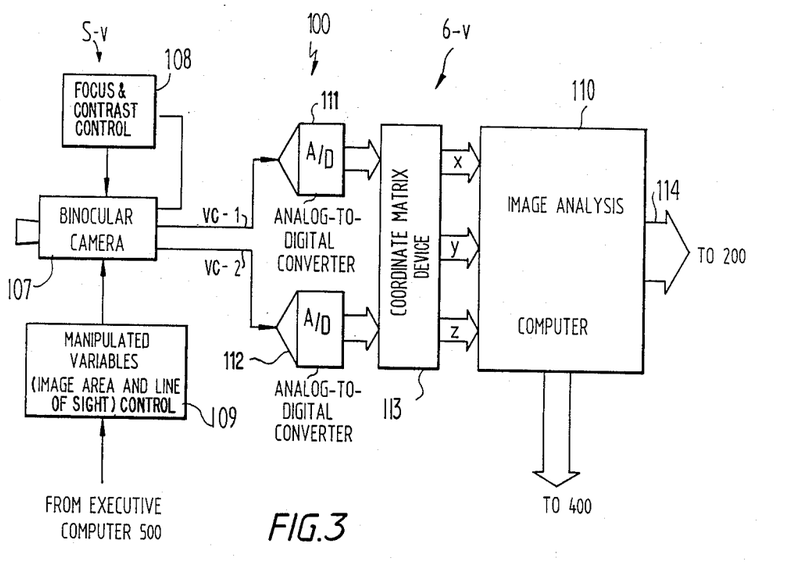
FIG. 3 is a more-detailed block diagram of a portion (for interpretation of visual environmental data) of a perception computer portion of the computer system of FIG. 2.

The sensor and perception processor system for the visual part of the perception computer 100 is shown in greater detail in FIG. 3. The sensor and perception processor systems for the tactile and auditory parts of the perception computer are of similar construction.

The function of the visual sensor and perception processor system is to convert the visual environmental information into meaningful, computer-usable information. The sensor S-v consists of a binocular camera 107, for example, a two-channel video camera, connected to a focus and contrast control 108, which operates automatically in analog fashion and a manipulated variables (image area and line of sight) control 109, by which image area and line of sight can be selected by servomotors (not shown). The control signals for these servomotors emanate from the executive computer 500.

The signals of both video channels VC-1, VC-2 from the video camera are fed to a image analysis computer 110 of the visual perception unit 6-v through fast analog-to-digital converters 111 and 112, respectively, in which the analog video signals are converted to binary signals. The latter are transferred cartesian (X, Y, Z) coordinates in a coordinate matrix device 113 having a three-dimensional coordinate memory for their temporary storage before feeding to the image-analysis computer 110. In the latter, the nature or shape of the environmental information (objects) picked up by the video camera and their position in space are determined on the basis of an analysis program either by comparison with similar, permanently stored bodies or by computation as computer-usable environmental data.

The transfer of this environmental data to the relations computer 200 is appropriately effected in a standardized transfer log 114 that is also suited for the additional perception processors 6-t, 6-a (FIG. 2) similarly ascertaining tactile and auditory data. Interpretation of the video signals, i.e. operation of the sensor S-v and visual perception processor 6-v system (FIG. 3), is continuous. If, in the course of the image analysis, values are encountered which are far beyond the usual working range, for example, in that they vary extremely rapidly, the perception computer 110 is able to intervene directly in the command computer 400 by connection thereto, for example, to interrupt an action being executed, such as a forward movement of the automaton, and, if indicated, to give an emergency command, such as RETREAT, to the command computer. Such emergencies and the attendant intervention in the command computer 400, which, as a rule, is rigidly predetermined, will be described further on.

Such perception computers for the processing of sensor signals and for image analysis may be constructed in conventional technology.

Figure 4:
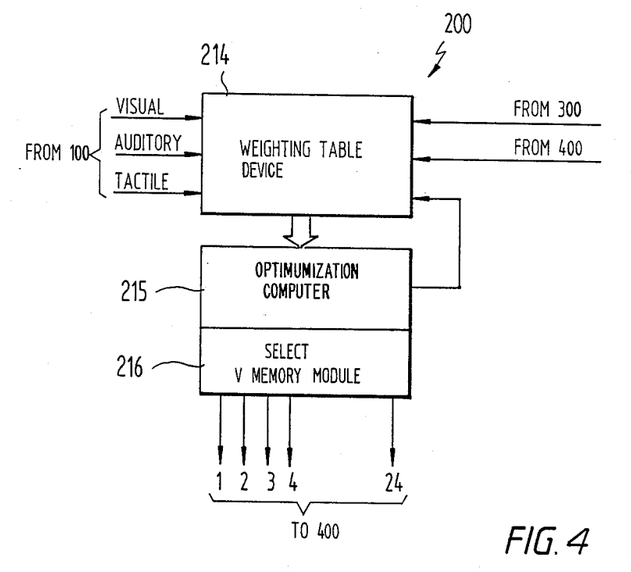
FIG. 4 is a more-detailed block diagram of a relations computer portion (for interpretation of environmental data and predetermined action information) of the computer system of FIG. 2.

The relations computer 200, as shown diagrammatically in FIG. 4, receives as input signals, from the perception computer 100, the environmental data, from the intended-action computer 300, a program sequence for a planned action to be executed, and from the command computer 400, the status signals identifying its current status. A weighting table device 214 assigns to each input signal an appropriate value by the use of a previously established weighting table. On the basis of these weighted data, there is determined in an optimumization computer 215 the optimum course of action, established by a program sequence, which is most likely to execute the program sequence for the planned action with due regard to the environmental data, i.e. the response best adapted to the environment. If indicated, weighting may be done repeatedly, so that a loop will form between the computer 215 and the weighting table device 214 if a preferred program sequence could not be established in the first weighting. When an unambiguous result is present at the output of the computer, it is entered in a select memory module 216, from which the computed program sequence is transferred to the command computer 400.

Figure 5:
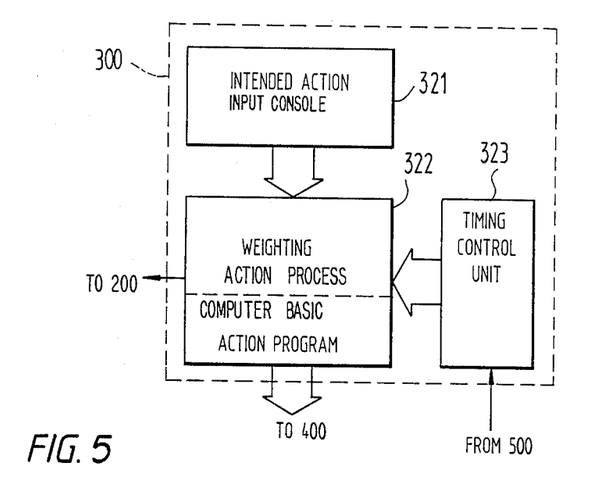
FIG. 5 is a more-detailed block diagram of an intended-action computer (for processing of the predetermined action information) portion of the computer system of FIG. 2.

The intended-action computer 300, as shown in FIG. 5, comprises an intended action input console 321 with an internal memory in which the courses of action, i.e. intended actions, are sequentially entered and stored, i.e. specified in a program table, before the start of operation of the computer system. The preprogrammed courses of action of the intended action input console are defined with respect to nature, duration and intensity and are sequentially processed in a connected action process computer 322 into a format adapted to the command computer 400, said format consisting of a Hamilton loop sequence, as will be explained further on.

The program so entered determines the intended sequence of actions for the computer system, this sequence of actions being monitored and controlled by a timing control unit 323. The latter predetermines, based on the indicated program, when the changeover to the next intended action is to occur, which then is again processed sequentially by the action process computer 322. The end of an intended action is entered in the computer by the timing control unit in two different ways. For one, the total time of the intended action is preset, so that at the expiration of this preset time, a changeover to the next intended action occurs. For the other, the timing control unit receives from the executive computer 500 a timing signal which reports that an intended action has been executed. This feedback produces in the timing control unit a desired value/actual value comparison from which, in turn, a criterion for the further operation of the action process computer 322 is derived. This timing control is important when a changeover to a new program sequence is made.

By means of the intended-action computer, a basic course of action for the system, represented by a Hamilton loop, is entered. As in the relations computer, weighting is effected between the preprogrammed intended action and the periodically controlled intended action entered in the action process computer through the timing control unit. From this weighting process, the action program which is basic at the time it is computed. The output data of the action process computer are also fed to the relations computer and there are weighted and processed further as described above.

The central processing unit of the system is the command computer 400, which is supplied with data by the input computers 100, 200, 300 as shown in FIG. 2. The data from the input computers are edited to adapt them to the operation of the command computer 400. The latter is constructed in the manner of a permutograph and establishes the current course of action of the system.

For illustration of operation and architecture of the command computer 400, in simplicity, it will be assumed that the command computer is constructed in the manner of the two-dimensional quadrivalent permutograph of FIG. 1 with 24 storage modules corresponding to the nodes or elements 1 to 24. With such a command computer with 24 storage modules, it is possible to handle four programs, each relating to a course of action (behavior pattern or mode), permutationally. It should be noted that in a realistic system, for example, for implementation of the automaton (FIG. 2), provision must be made for considerably more programs or courses of action, and the command computer must be, therefore, expanded to correspond to a multivalent three-dimensional permutograph.

As indicated in the above table, there exist in the assumed two-dimensional quadrivalent permutograph of 24 storage modules 44 closed Hamilton loops, each of which is defined, as described above, by a specific negation sequence. From these four Hamilton loops HK1 (HL in FIG. 1) and HK2 to HK4, starting in each case at storage module 1 (FIG. 1) with the following negation sequences, are selected:

HK1 (HL in FIG. 1): 1-2-3-2-3-2-1-2-1-2-3-2-3-2-1-2-1-2-3-2-3-2-1-2
HK2: 3-1-2-3-2-1-2-1-2-3-2-1-3-1-2-1-2-1-3-1-2-1-2-1
HK3: 1-2-3-1-3-2-3-2-3-1-3-2-3-2-3-1-3-2-1-2-3-2-3-2
HK4: 1-3-1-2-3-1-3-2-1-3-1-2-3-1-3-2-1-3-1-2-3-1-3-2

With each of these four Hamilton loops HK1 to HK4, a specific course of action is associated. For example, suppose that the course of action for Hamilton loop HK1 is "Get your bearings!", or, expressed as a command to the visual sensors, LOOK.

Let the course of action for Hamilton loop HK2 be a forward movement, or, as a command, FORWARD.

Let the course of action for Hamilton loop HK3 be "Stand still!", or, as a command, STOP.

Let the course of action for Hamilton loop HK4 be a backward movement, or, as a command, RETREAT.

To each of the storage modules ①to㉔, there is now applied a permutation of the programs associated with these courses of action, as shown above in the lexicographic tabulation for four programs. In conformity with the Hamilton loops, these programs thus are:

Program 1—an orientation program,
program 2—an approach program,
program 3—a stop program, and
program 4—a retreat program.

These four programs are implemented by activation of each associated Hamilton loop on the basis of the output data of the input computers 1, 2 and 3. These four programs are further stored in a specific sequence in the intended-action computer after the intended-action sequence has been specified. Moreover, a program sequence can be held available in the relations computer on the basis of environmental information.

Suppose that for this very simple overall system there is first programmed in the intended-action computer, for a given period of time, the action sequence 1-2-3-4, and then, expressed as commands, the action sequence LOOK, FORWARD, STOP, RETREAT. Since this program sequence is established by storage module, , the associated Hamilton loops HK1 to HK4 are also sequentially pulsed and sequentially run through by that storage module. This run is monitored by the timing control unit 23. However, this will occur only if the relations computer 2 has also computed the program sequence 1-2-3-4 from the environmental information—in this simple model, from the edited information of the binocular video camera 7—or does not hold in readiness any other, higher-priority program based on the weighting in the relations computer. Since during the program run, that is to say, during the sequential run through the Hamilton loops, the sensor system 1 and the relations computer 2 constantly provide new information that is compared with the intended actions, the meaning in said case is:

The planned motion sequences can be executed (program 1)—The path leading to the destination is clear (program 2)—The destination has been reached; there is no further movement (program 3)—It is all right to return to the point of departure (program 4).

Now suppose that during the execution of the intended-action program the sensor system 1 detects an obstacle. From this the relations computer 2 will compute, for example, the program sequence 3-4-1-2, meaning:

An object stands in the way (program 3)—It is necessary to retreat (program 4)—Look for a new path (program 1)—Move forward (program 2).

If following weighting in the relations computer 2 this new program sequence is identified as having priority, that is to say, the planned program sequence based on the intended action cannot be executed for the time being due to environmental factors, the relations computer 2 interrupts the command execution in the command computer 4 and switches the latter to the new program sequence. As is apparent from the lexicographic tabulation and also from FIG. 9, this new program sequence 3-4-1-2 (STOP-RETREAT-LOOK-FORWARD) is assigned to storage module 17. The relations computer 2 in this case accesses storage module 17, which then switches the command computer 4 first to the new Hamilton loop HK3.

Thus, any storage module is able, as holder of the appropriate environmental information, to set in motion a sequence of actions, and is able to do so in two ways:
(a) Either the sequence of actions specified by the intended-action computer has already been assigned to the storage module,
(b) or the storage module compels the command computer to change the sequence of actions on the basis of the program sequence associated with the storage module.

The command computer may be assembled from separate storage modules. Such a storage module M-i is shown diagrammatically in FIG. 10, i designating the number of the storage module. If the storage module M-i itself is not activated and thus does not determine the execution of the actions, it merely serves as a switch permitting the currently activated Hamilton loop to be closed. To this end, the Hamilton module M-i comprises an addressable negation memory 31. Stored in the latter are, for each possible Hamilton loop to which the storage module M-i can be switched, the negation values and the number of the storage module which is next in the currently activated Hamilton loop. The negation memory is accessed through an address line 32 internal to the computer and through a control line 33. The address line 32 is connected to all storage modules M which are located ahead of this storage module M-i as all possible Hamilton loops are run through. Through the control line 33, the negation memory 31 is informed, either within the computer or by the input computers, which Hamilton loop is currently activated. The output data of the negation memory are also determined by these input data over the control lines 32 and 33. The address of the storage module which is next in the currently activated Hamilton loop is determined on the basis of the number of that Hamilton loop. This address is communicated through an address output line 34 to a switching section 35 of the storage module. The negation value which transforms the permutation of the program sequence of that storage module into the permutation sequence of the next storage module is also determined. This negation value, which in the case of the two-dimensional quadrivalent command computer described may assume the values 1, 2 or 3, is transferred to a command output line 36 and written into an output register 37. (See FIG. 9.) On the basis of the data on the address output line 34, the switching section 35 of the storage module M-i cuts in the storage module M which is next in that Hamilton loop. The output lines of this switching section 35 are designated 1, 2 and 3 in conformity with the associated negation values. These output lines thus correspond to the address lines internal to the computer, which in FIG. 10 is illustrated by (32).

Apart from this simple switching function, the storage module M-i can be actuated by the input computers 1, 2 and 3 in such a way that it will determine the current course of action and the execution of the actions. To this end, the storage module M-i comprises a program memory 38 in which a permutation of the specified programs—in this case, four—is stored. Now when that program sequence is designated by the input computers as the program sequence to be executed, that storage module is activated. This is done through address-dependent activating lines 39 and control lines 40 which indicate the number of the selected Hamilton loop. The activating lines 39 and the control lines 40 are logically interconnected with the address lines 32 and the control lines 33, with the result that when the storage module is activated as action-determining module, the logic functions defined by the negation memory 31 are performed. The function of storage module M-i is determined by a module control unit 41, which determines whether the storage module is action-determining and, if indicated, switches the command computer over to a new Hamilton loop. The number of the particular Hamilton loop concerned is outputted through a status line 42, fed back to the controlling input computers, and used within the computers for the control of the next runs through the Hamilton loops.

The feasibility of activating one of the storage modules M is further determined by a decision mechanism that is priority-dependent. That priority establishes which of the activating signals arriving over the activating lines 39 will determine the function of the current storage module. The more urgent an action to be executed is, the higher the priority level for the storage medium is set. For the command computer shown, the ranking of priorities is as follows:
(a) Activation of the storage module by modification of the intended action in the intended-action computer (lowest priority);

(b) Activation of the storage module by a changed environmental situation computed in the relations computer (medium priority); and (c) direct activation of a storage module on the basis of an emergency or crisis message from a perception computer (highest priority).

In the case described, these priorities may be the levels 1, 2 and 3. When a storage module M is activated, the appropriate priority level is written into a priority memory 43 simultaneously with such activation. As the current Hamilton loop is being run through sequentially, this priority level is communicated also to the other storage modules. Now when a storage module having a higher priority level is activated—for example, in a transfer of activation from the intended-action computer to the relations computer—the module activated with a lower priority is ignored. In this case, a changeover is made to another Hamilton loop corresponding to the higher-priority storage module. A switching back to the previously activated basic Hamilton loop is made only when no higher priority level is present at the storage modules.

In a command computer thus assembled from addressable separate read-only memories or storage modules M, the decisions concerning a particular course of action are made within the command computer on the basis of input data from the perception computer, the relations computer and the intended-action computer. The only requirement for the operation of the overall system is that the intended-action computer select a particular storage module which corresponds to the preprogrammed intended action. This intended action is then modified, if indicated, on the basis of environmental information without the intended action specified being lost sight of.

Figure 6:
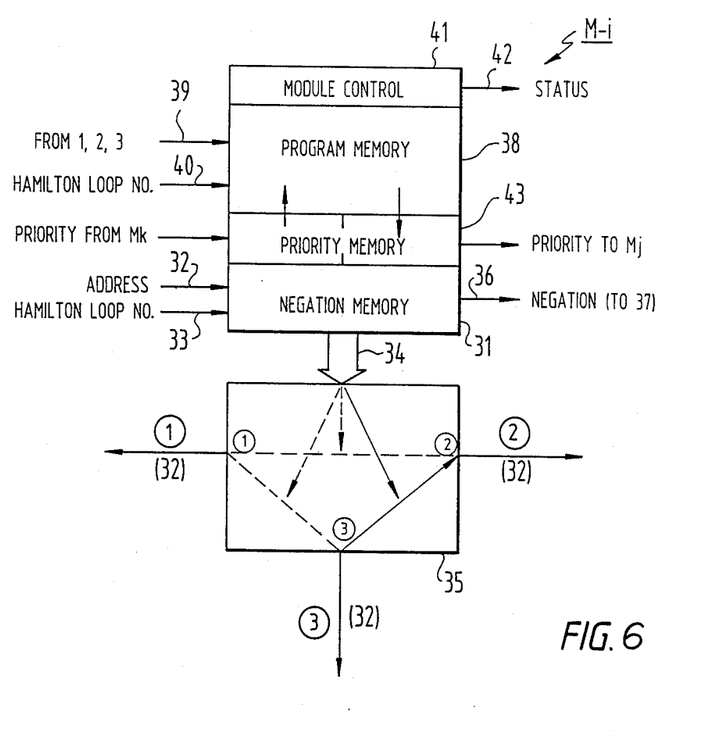
FIG. 6 is a diagrammatic representation of a storage module portion of a command computer portion of the computer system of FIG. 2.

A command computer 4 will now be described, with reference to FIGS. 7 to 9, which again is designed only for four courses of action, that is, for four Hamilton loops with the corresponding programs. This command computer 4 is not assembled from separate storage modules as is the one of FIG. 6. Rather, for each Hamilton loop—in this case, the Hamilton loops HK1 to HK4—a permanently preprogrammed, addressable read-only memory, ROM 1 to ROM 4, is provided. The memory locations of the individual ROM's are scanned by means of an address in conjunction with an enable signal, with the preprogrammed information concerning the selected addresses appearing at the outputs of the memory.

Figure 7:
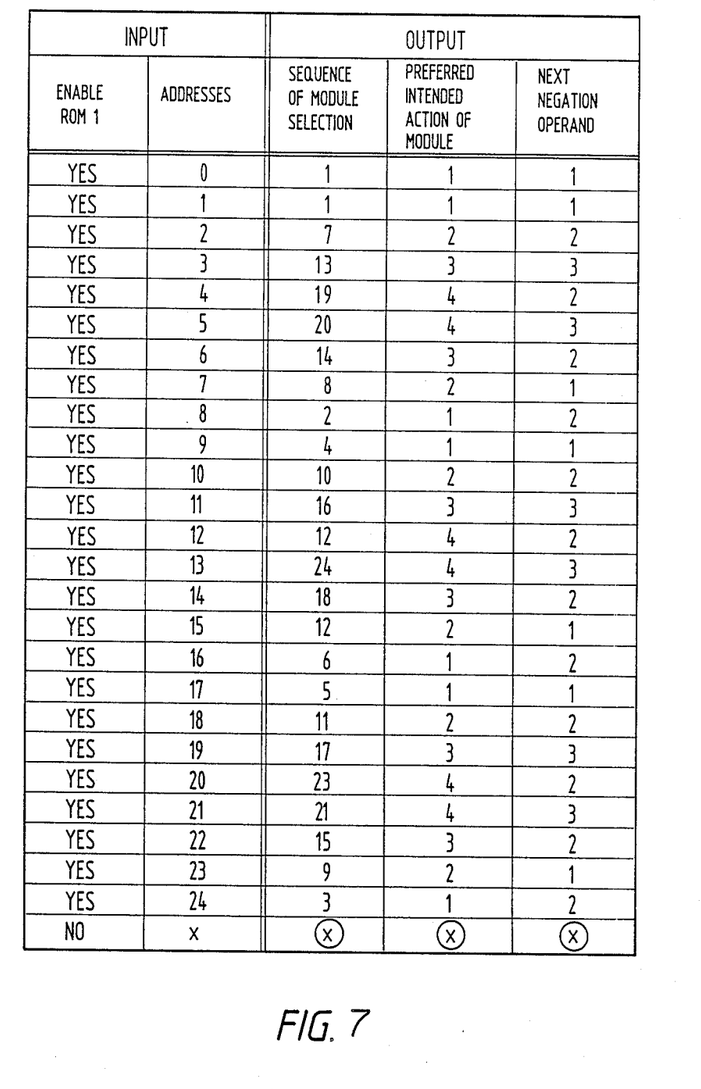
FIG. 7 is a programming table for a read-only memory for establishment of a Hamilton loop in the command computer portion of the computer system of FIG. 2.

Shown in FIG. 7 is a programming table for the storage module ROM 1 for the Hamilton loop HK1. When this storage module is accessed at its 24 addresses, there appear as output the sequence of the storage modules sequentially run through in this Hamilton loop HK1, and also the currently preferred intended action corresponding to the first number of the programs in the permutation sequence as well as the next negation value. This table can, of course, be expanded so that the priority levels mentioned above, further intended actions of the module corresponding to the permuted program sequence, etc., are represented. When this read-only memory is accessed, it is constantly enabled; otherwise it is blocked.

Figure 8:
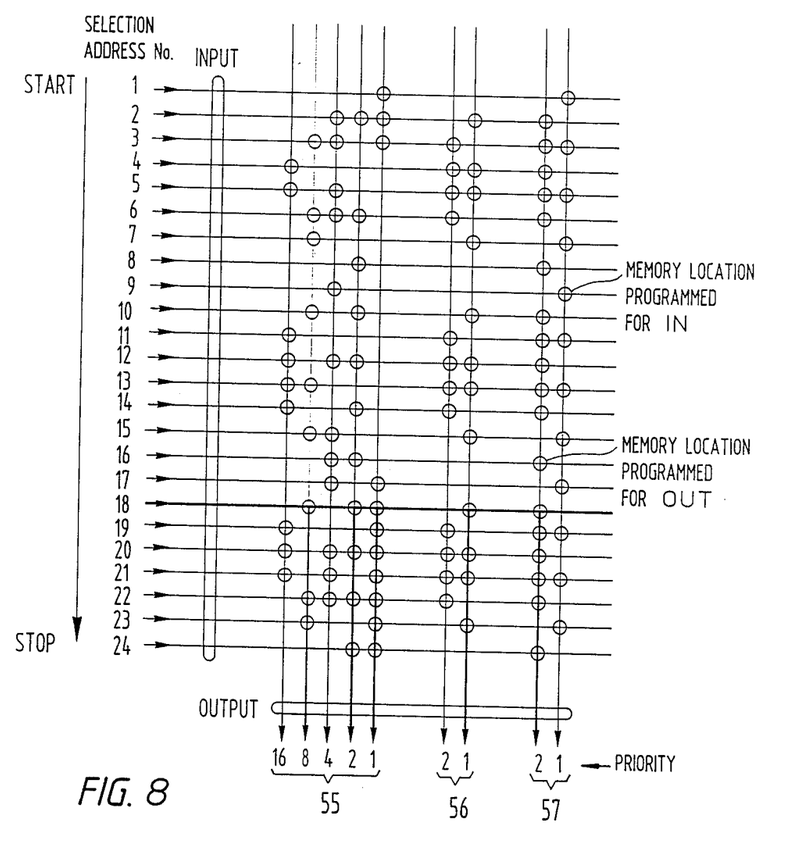
FIG. 8 is a diagrammatic representation of the memory locations in the read-only memory of FIG. 7.

FIG. 8 illustrates the implementation of the read-only memory in matrix form, that is to say, by a grid between the address lines 1 to 24 and the output lines. Small circles at the intersections signify that the memory location situated there is programmed for IN. The absence of such a circle indicates that the memory location situated there is programmed for OUT. To save places, the numbers 1 to 4 of the Hamilton loops HK1 to HK4 are programmed as 0 to 3. This matrix memory can also be expanded in accordance with the programming table in FIG. 11.

It is apparent that in the sequential scanning of the addresses 1 to 24 there will successively appear at the output of the read-only memory ROM 1 the number of the current storage module, its preferred Hamilton loop, and the associated negation value corresponding to one pass through Hamilton loop HK1. For illustration, an example is given for the address 18. The latter thus corresponds to storage module No. 11 with the preferred Hamilton loop 2 and the next negation value 2.

Figure 9:
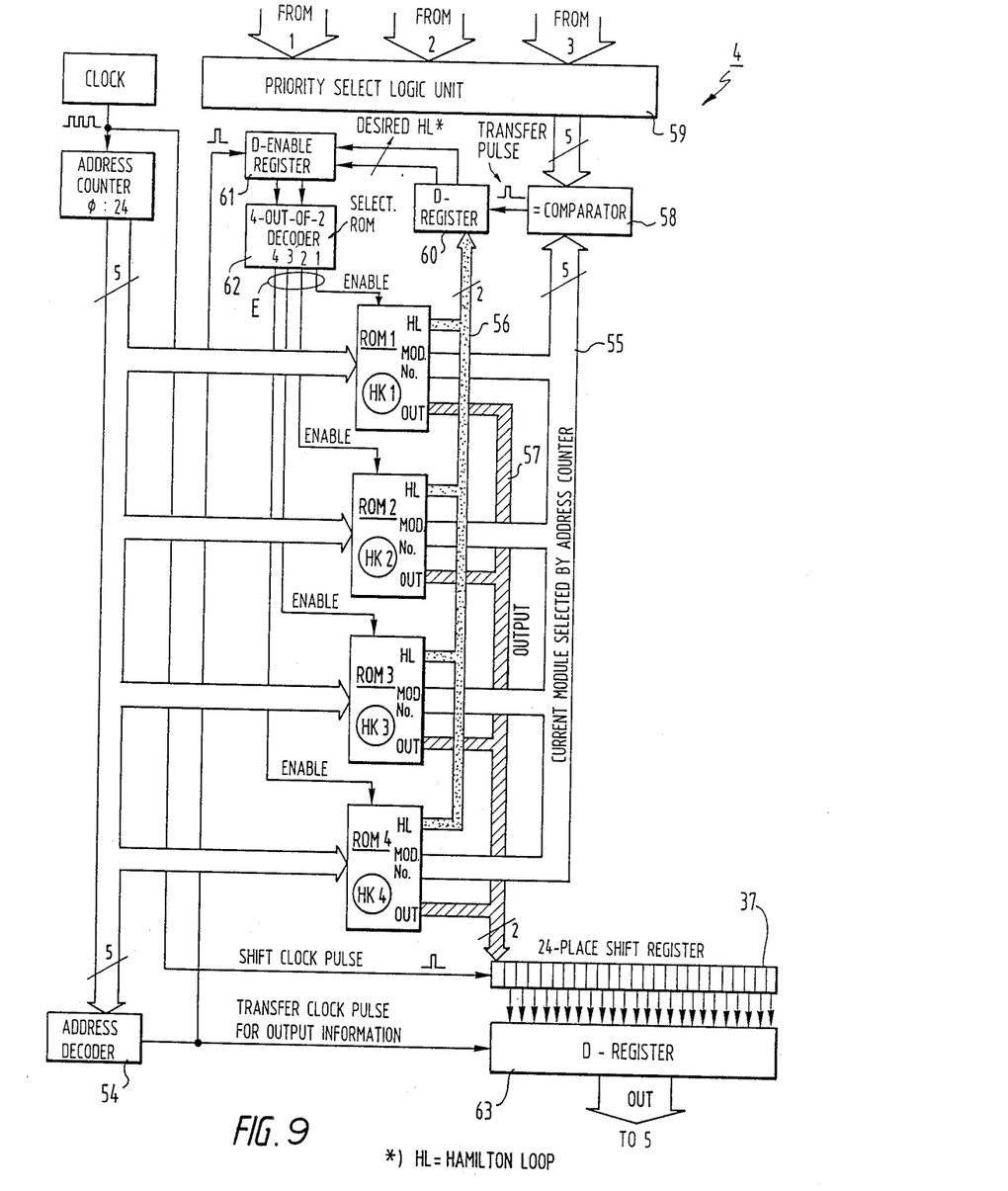
FIG. 9 is a block diagram of a command computer (with four Hamilton loops and input and output logic) for the embodiment of FIG. 2.
Figure 10:
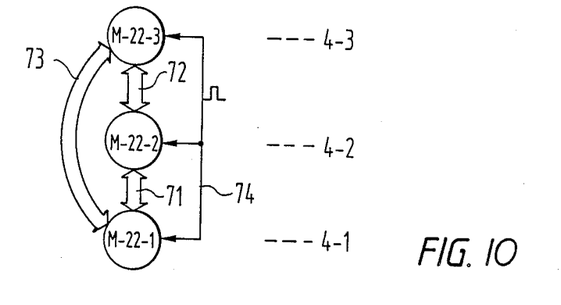
FIG. 10 is a diagrammatic representation of three like storage modules in a somatotopically stacked command computer for illustration of the priority selection of a specific command computer for the embodiment of FIG. 2.

Shown in FIG. 9 is a block diagram for a single-layer command computer 4 having four such read-only memories, ROM 1 to ROM 4, for the four Hamilton loops HK1 to HK4. An internal clock 51 controls an address counter 52 with 24 places which through a data bus is connected to the address inputs of the individual read-only memories and also to an address decoder. Over three data buses 55, 56 and 57 on the output side, there are outputted in each case, in accordance with the above memory distribution, the number of the now current storage module, the number of its preferred Hamilton loop, and the associated negation value. The data bus 55 is connected to a comparator 58 which compares the number of the now current storage module with that of the storage module selected by the input computers as the preferred storage module. This selection is made by a priority-selecting logic unit 59 which specifies to the comparator 58 only the number of the storage module that has the highest priority at the time. For example, if the storage module selected by the relations computer 2 is the now current storage module, the comparator 58 generates a pulse. That pulse is responsible for the transfer of the information, specified by the current storage module, concerning the selection of another Hamilton loop. To the output of the comparator 58 there is connected a dynamic register 60 to which the read-only memories communicate, over the data bus 56, the Hamilton loop numbers of the current storage module. With a rising pulse edge of the generator output signal, that is to say, when the current storage module coincides with the storage module preferred by the input computers through the priority-selecting logic unit 59, the dynamic register 60 accepts the number of the Hamilton loop specified by that storage module. To the output of the dynamic register 60 there is connected a dynamic enable register 61 that is followed by a four-out-of-two decoder 62. The control input of the dynamic enable register 61 is connected to the output of the address decoder 54, which provides assurance that a pass through a Hamilton loop is completed before a changeover to another Hamilton loop can be made. The four output lines of the four-out-of-two decoder 62 are connected to the enable inputs of the four read-only memories ROM 1 to ROM 4, respectively, the four-out-of-two decoder 62 being able at all times to enable but one read-only memory.

The data bus 57 on which the sequence of negation values is present is connected to the input of a 24-place shift register 37 whose shift pulse is determined by the clock 51. During the sequential run through the Hamilton loop being activated, the individual information, that is to say, the sequence of negation values which determines the current Hamilton loop, is accumulated address-dependently in shift register 37 until the entire Hamilton loop has been run through once from beginning to end. On completion of this run, the output information of the shift register 37 is transferred to a further dynamic register 63. This transfer is initiated by the address decoder 54, which delivers a transfer pulse to the dynamic register 63 as soon as the Hamilton loop has been run through. This enable pulse is also applied to the control input of the dynamic enable register 61.

The output information of the dynamic register 63 is then fed to the executive computer 5 and there converted to operating signals for the individual servomotors of the overall system.

Suppose, for example, that within the preprogrammed program sequence 1-2-3-4 indicated above storage module 1 within Hamilton loop 1 is being accessed since this storage module also contains the preprogrammed sequence of actions. The number of this storage module then appears at one input of the comparator 58. In this case, only the read-only memory ROM 1 is enabled, so that the negation sequence of this Hamilton loop 1 is successively written into the shift register 37. Now suppose that it is found on the basis of environmental information that the specified program cannot be executed, and that in its place the program sequence 3-4-1-2 (RETREAT, STOP, OBSERVE, FORWARD) must be executed. This program is assigned to storage module ⑰. Accordingly, the number of this storage module is fed by way of the priority-selecting logic unit to one of the inputs of the comparator 58. Now if during the run through the Hamilton loop being activated, HK1, the number of this storage module appears at the second input of the comparator, the latter delivers a transfer pulse to the dynamic register 60. To the latter there is simultaneously communicated the number of the preferred Hamilton loop of the newly accessed storage module, in this case, the Hamilton loop number 3, and accepted by the dynamic enable register 61. As soon as the currently activated Hamilton loop, HK1, has been completely run through, the dynamic enable register is enabled by an access pulse from the address decoder 54. Through the four-out-of-two coder 62, the read-only memory ROM 3 is now enabled, so that a changeover to the new Hamilton loop 3 occurs. This Hamilton loop remains activated until the input computers communicate to the comparator 58 a new module number.

The speed of response of the command computer can be computed on the basis of the maximum clock frequency which the circuit can handle and of the number of storage modules. In the case of the simple command computer described, the maximum clock frequency can be assumed to be 100 MHz, so that with 24 storage modules a run through a Hamilton loop will take 240 nsec.

When several "sensory organs", for example, the three sensor groups S-v, S-t and S-a mentioned above, are used, the command computer must be somatotopically stacked, as pointed out earlier. This can be done also in the case of the embodiment shown in FIG. 9, simply by assembling three such command computers, which are operated in strict synchronism. The command computer where the storage module selected has the highest priority is then activated in each case. This is shown diagrammatically in FIG. 10 for three like storage modules M-22-1, M-22-2 and M-22-3. Storage module M-22-1 is associated with a "visual" command computer 4-1, module M-22-2 with a "tactile" command computer 4-2, and module M-22-3 with an "auditory" command computer 4-3. The three storage modules are interconnected by bidirectional data lines 71, 72 and 73 on which the priority levels of the individual storage modules appear. As pointed out earlier, this priority level may also be preset in the read-only memory for a Hamilton loop, for example, and be present at the output of the current ROM. The priority levels are compared with one another within the individual storage modules. For example, the storage module preferentially activated by the relations computer will compare its priority level with the priority levels of the like modules fed in over the data lines 71, 72 and 73. When one of the like modules, for example, module M-22-2, has a higher priority level than the storage module last cut in, for example, storage module M-22-1, the higher-priority storage module transmits over a changeover line 74 a pulse requesting a changeover. Through this changeover pulse, all storage modules with the exception of the one transmitting the pulse are switched to data reception and receive the information concerning the priority level of the newly activated storage module. As pointed out earlier, the priority levels are permanently preset for the individual command computers, command computer 4-1 for module M-22-1 having the level 2, command computer 4-2 for module M-22-2 the priority level 3, and command computer 3 for module M-22-3 the priority level 1. In the case illustrated in FIG. 10, storage module M-22-1, for example, transmits to the two other storage modules the priority level 2. When the central address counter—corresponding to address counter 51 in FIG. 9—scans all modules M-22 and in addition to storage module M-22-1 a like module, for example, module M-22-2, is being activated by the corresponding relations computer, the priority level 2 which is present is compared with the internal priority level 3 of module M-22-2. Since the priority level 3 of the latter is higher than the priority level 2, a changeover pulse is transmitted by the storage module M-22-2. The priority level 2 transmitted by storage module M-22-1 becomes invalid, and storage module M-22-1 now receives from storage module M-22-2 the priority level 3. Storage module M-22-2 cuts in its associated command computer 4-2. When the activation of storage module M-22-2 is then cancelled, another changeover pulse is transmitted. Since module M-22-1 continues to be activated, it now transmits its priority level 2 to the other storage modules, which causes the command computer 4-1 to be activated. Through such handling of the priority levels, only one output information corresponding to the negation sequence of a single cut-in command computer will reach the executive computer at a time.

As pointed out earlier, the sensor system 1 is able to intervene, through the perception computers 6, directly in the command computer 4 when a crisis or emergency arises. Such intervention carries the highest priority. The emergency is communicated by the perception computer 6 directly, with elimination of the corresponding relations computer, to the storage module within the command computer through which the emergency can be coped with. In the case of the simple command computer patterned on a two-dimensional quadrivalent permutograph here dealt with, it is apparent from the lexicographic order of the permutation sequences that in each case the first digit corresponding to a program remains constant six times. For example, if the emergency can be resolved by executing program 2 so that FORWARD is executed, then six storage modules can be accessed for the purpose. Direct lines to these storage modules are run from the respective perception computers 10 of the sensor system 1 by way of the priority-selecting logic unit. For resolving it, only the first value in the permutation sequence corresponding to a course of action is controlling. In an "emergency" there thus is in each command computer for every course of action a fivefold modular redundancy, which is of the utmost importance with regard to the self-preservation of the overall system. In an emergency, the storage module is accessed which in the run through the current Hamilton loop is accessed first. Such accessing occurs automatically through the comparison, referred to above, in the comparator 58. Once the emergency is resolved, the interrupted program is continued on the basis of the specifications from the relations and intended-action computers. The major difference with respect to the data transfer between the other input computers and the perception computers is that the former basically deliver to an appropriate storage module weighted information for all—in this case, four—courses of action in a formally biunique manner, whereas the perception computers are able to provide all six storage modules with the initial value corresponding to the emergency information. The storage module that is then selected is the one which is accessed as the next storage module during the run through the Hamilton loop.

An overall system comprising a command computer in accordance with the invention will have the following typical redundancies:
1. Modular redundancy within a command computer structured as a permutograph;
2. modular redundancy between the individual command computers; and
3. modular redundancy for decision-making on action in the case of direct information corresponding to an emergency by the appropriate perception computer.

Thus the command computer is inoperative neither in the case of module breakdowns within the permutograph nor in the case of failure of one or more permutograph systems.

Instead of being based on the principle of a permutograph, the system of the invention may be constructed on the principle of a kenograph. The underlying a kenograph are substantially the same as those of a permutograph, the elements (nodes and storage modules) being formed by kenograms.

Further details on kenographs will be found in:
Günther G. "Cybernetic Ontology and Transjunctional systems", *Self-Organizing Systems*, Jovits, Jacobi and Goldstein, Spartan Books, Washington, 1962, pages 313–392.
Günther G., "Time, Timeless Logic and Self-Referential Systems, *Annals of the New York Academy of Sciences*, vol. 138, No. 2, 1967 pages 396–406.

A quotation from the paper "Assembly of Computers to Command and Control a Robot" by L. Sutro and W. Killmer, published in *Proc.* 1969 *Spring Joint Computer Conference*, Boston, Mass., on page 172 will illustrate the redundancy of potential command secured with a command computer in accordance with the invention:

"The information organization of the formatio reticularis is comparable to a medical staff that must decide on the treatment which a number of patients are to receive. Suppose that the staff consists of 12 physicians who are both general practitioners and specialist in different areas of medicine, and that they must select from among four possible treatments. Their deliberations resemble the process by which the formatio recticularis selects a course of action. Like the medical staff, the command computer (formatio recticularis) must base its command on a behavior which in most cases is a function of the information that has acted upon it within the last few seconds. (Signals which indicate this mission are parts thereof.) . . . The section of the command computer which at any given time contains the most important information has priority over the course of action."

The invention may thus form the basis for the principle of an automatic diagnostic clinic.

I claim:
1. A computer system for simulating reticular formation operation comprising, in combination:
   (a) an input computer for producing signals representing, respectively, both the actual environment and the intended action to be taken; and
   (b) a command computer, connected to said input computer, for executing a program on the principle of a permutograph thereby to give effect to said intended action in dependence upon said environment, said command computer comprising:
      (1) a plurality (n) of addressable storage modules (M-1, M-2, . . . M-i, . . . M-n), each storage module including a program sequence memory for storing, as a storage module address, a unique program sequence corresponding to at least one intended action, the different program sequences stored, respectively, in different program memories being permutations of each other; and
      (2) means for connecting said storage modules together into closed circuits, called "Hamilton loops", each Hamilton loop forming a series connection of a plurality of storage modules in a specific permutation of said program sequences that identify said storage modules by address;
      whereby a specific run through the storage modules in the sequence defined by a Hamilton loop prescribes a specific course of action to be taken to effect said intended action.

2. The computer system of claim 1, wherein said input computer includes:
   (1) a perception computer for sensing the environment and producing signals representing environmental data; and
   (2) an intended action computer for producing signals representing successive ones of a plurality of program sequences.

3. The computer system of claim 2, wherein said input computer further comprises a relations computer, connected to said perception computer and to said intended action computer, for weighting the environmental data from said perception computer according to a table set by the program sequences provided by said intended action computer, said relations computer producing signals representative of said weighting which are supplied to said command computer.

4. The computer system defined in claim 3, wherein said intended action computer computes from data programmed therein a first Hamilton loop sequence and produces signals representing said first Hamilton loop sequence; and wherein said relations computer is responsive to said environmental data produced by said perception computer to compute a second Hamilton loop sequence with respect to the environmental data and to compare said second Hamilton loop sequence with said first Hamilton loop sequence produced by said intended action computer; and wherein said connecting means of said command computer is responsive to said relations computer to connect said storage modules together in a particular Hamilton loop sequence determined in the comparison.

5. The computer system of claim 2, wherein said intended action computer computes from data programmed therein a Hamilton loop sequence.

6. The computer system of claim 2, wherein the perception computer (100) has a plurality of different sensors (S-v, S-6, S-a), the command computer (400) comprises the same number of command computers (4-1, 4-2, 4-3), all of the same construction and activated synchronously by a central clock (51), an established priority value being associated with the storage modules (M-i-1, M-i-2, M-i-3) located at the same places in different ones of the command computers, the storage module (M-i-1, M-i-2, M-i-3) of the command computers with the highest priority being activated.

7. The computer system of claim 2, wherein the intended action computer (300) has a timing control unit (323) for the time sequence of the intended actions thereof.

8. The computer system of claim 7, and further comprising an executive computer (500) connected to the command computer (400) for converting the commands of the command computer (400) into control signals for a motor and the timing control unit (323) of the intended action computer (300).

9. The computer system of claim 1, wherein each storage module of said command computer further includes a negation operator memory for storing a negation operator which, when executed, is capable of transforming the program sequence stored in the program memory of the associated storage module into another program sequence, the program sequence and the negation operator of each storage module defining the program sequence of the next successive storage module in a particular Hamilton loop.

10. The computer system of claim 9, wherein said command computer further comprises an output register and means for storing the negation operators associated with each Hamilton loop in said output register.

11. The computer system according to claim 9, wherein each said negation operator memory is addressable and has stored therein the negation operator for each Hamilton loop (HK1 to HK4) which defines, together with the address of its associated storage module, the address of the next storage module in the Hamilton loop.

12. The computer system according to claim 11, wherein each storage module further includes a switching section (35) connected to said negation operator memory for activating the next storage module in the respective Hamilton loop.

13. The computer system according to claim 12, wherein each storage module further includes:
an addressable program memory for storing the permutation of programmed sequences assigned to that storage module, said program memory of each storage module being connected to said input computer; and
a module control unit (41) connected to said program memory, for transforming the command computer, upon activation of the program memory, to a state that is defined by the program sequence stored in said program memory.

14. The computer system of claim 1, wherein each storage module (M-i) further comprises a priority memory (43) in which is stored a previously established priority value for each selected Hamilton loop, the priority memory being connected to the priority memories of the rest of the memory modules (M-i).

15. The computer system of claim 14, further comprising an output circuit (59) connected between the input computer (100, 200, 300), on one hand, and the command computer (400), on the other, having a priority selected logic which selects the program with the highest priority for the command computer (400).

16. The computer system of claim 1, wherein the command computer (400) further comprises a read-only memory (ROM1 to ROM4) for each selected Hamilton loop (HK1 to HK4) connected in matrix form and a clock (51) for sequentially addressing said read-only memories, the memory locations of said read-only memories being at intersections of address lines and output lines (55, 56, 57), such that at least the number of the particular storage module (M-i) and an associated operation value for the selected Hamilton loop are presented at different groups of the output lines (55, 56, 57) upon sequential activation of the address lines, said output lines (55) carrying said numbers of the storage modules (M-i) being connected to one input of a comparator (58) the other input of which is connected to an output circuit (59) of the input computer (100, 200, 300) which supplies the number of the storage module (M) which is selected as the preferred storage module by the input computer (100, 200, 300), the output of the comparator (58) as well as said output lines (56) carrying the number of said selected Hamilton loop of the memory modules (M) of the read-only memories (ROM1 to ROM4) being connected to a register-decoder circuit (60, 61, 62) an output (E) of which is connected to a releasing input of one of the read-only memories (ROM1 to ROM4, and the output lines (57) carrying the operation values of the read-only memories (ROM1 to ROM4) being connected to an output register (37, 63), the output register (37, 63) having an address decoder (54) which, after a compete run of a Hamilton loop, prepares the sequence of operation associated with the latter.

17. The computer system of claim 16, wherein the output register (37, 63) comprises a shift register (37) controlled by the clock (51), the shift register (37) being connected to the output lines carrying operation values of Hamilton loops and having parallel outputs, and a dynamic acceptance register (63) having inputs connected to the parallel outputs of the shift register (37) for accepting the data therefrom under the control of the address decoder (54) after a complete run-through of a Hamilton loop.

18. The computer system of claim 17, wherein the register-decoder circuit (60, 61, 62) has a release input which is connected with the address decoder (54).

19. The computer system of claim 16, wherein the register-decoder circuit (60, 61, 62) has a release input which is connected with the address decoder (54).

* * * * *